(12) United States Patent
Benjamin

(10) Patent No.: US 6,255,761 B1
(45) Date of Patent: Jul. 3, 2001

(54) SHAPED PIEZOELECTRIC COMPOSITE TRANSDUCER

(75) Inventor: Kim C. Benjamin, Portsmouth, RI (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 0 days.

(21) Appl. No.: 09/416,115

(22) Filed: Oct. 4, 1999

(51) Int. Cl.[7] .................................................. H01L 41/04
(52) U.S. Cl. ............................................................ 310/334
(58) Field of Search ..................................... 310/328, 333, 310/357, 366, 367, 368, 334, 322, 335, 336, 337

(56) References Cited

U.S. PATENT DOCUMENTS

| | | | |
|---|---|---|---|
| 4,677,337 | * 6/1987 | Kleinschmidt et al. | 310/334 |
| 4,683,396 | * 7/1987 | Takeuchi et al. | 310/358 |
| 5,325,011 | * 6/1994 | Kahn et al. | 310/358 |
| 5,539,965 | * 7/1996 | Safari et al. | 29/25.35 |
| 5,869,189 | * 2/1999 | Hagood, IV et al. | 428/461 |
| 5,995,453 | * 11/1999 | Hirata | 367/155 |
| 6,020,675 | * 2/2000 | Yamashita et al. | 310/358 |
| 6,043,590 | * 3/2000 | Gilmore | 310/367 |

* cited by examiner

Primary Examiner—Nestor Ramirez
Assistant Examiner—Peter Medley
(74) Attorney, Agent, or Firm—Michael J. McGowan; James M. Kasischke; Prithvi C. Lall

(57) ABSTRACT

A piezoelectric composite transducer and method for making same are disclosed. A block of piezoelectric material has a common base and a plurality of uniform-length rods extending from the common base in a parallel spaced-apart fashion to define an array. A first surface region is defined at outboard ends of the rods and a side region is defined about the periphery of the array. Electric conductors extend through the side region, are routed parallel to the first surface region, and are then led substantially parallel to the rods to the first surface region. Spaces between the rods are filled up to the first surface region with a viscoelastic material. The common base of the block is then removed such that a second surface region parallel and opposite to the first surface region is defined. Electrodes are deposited at the first surface region to be in contact with the rods and in electrical contact with the electric conductors. A ground electrode is deposited at the second surface region to be in contact with the rods. The resulting piezoelectric composite transducer can be heated and shaped to conform to complex curves.

14 Claims, 2 Drawing Sheets

SHAPED PIEZOELECTRIC COMPOSITE TRANSDUCER

STATEMENT OF GOVERNMENT INTEREST

The invention described herein may be manufactured and used by or for the Government of the United States of America for Governmental purposes without the payment of any royalties thereon or therefor.

BACKGROUND OF THE INVENTION (1). Field of the Invention

The present invention relates generally to piezoelectric composite transducer assemblies, and more particularly to a piezoelectric composite transducer assembly that can be shaped into a complex curved configuration.

(2). Description of the Prior Art

Transducer assemblies are frequently mounted on a supporting structure which currently must be a flat or simply curved surface. These situations can be handled by one-dimensionally curved transducers made from either injection molded 1–3 piezocomposites or flex circuits with composite conductive/non-conductive adhesive films. However, in many underwater acoustic applications, it is desirable to have a transducer assembly conform to a structure that presents a more complex curved surface. For example, most underwater vehicles are curved in one direction across the bow and curved in another direction from bow to stern. If the same transducer assembly must conform to both of these curves, the only option is to design and laminate a contour specific flex circuit to adhesive film components. Alternatively, flat sensors may be attached in piecewise fashion to approximate a curved surface. Unfortunately, these assemblies are very expensive to design and fabricate.

SUMMARY OF THE INVENTION

Accordingly, it is an object of the present invention to provide a transducer assembly and method for making same that can be shaped to conform to complex curves.

Another object of the present invention is to provide a transducer assembly and method for making same that is cost effective.

Other objects and advantages of the present invention will become more obvious hereinafter in the specification and drawings.

In accordance with the present invention, a piezoelectric composite transducer array and method for making same are disclosed. A block of piezoelectric material has a common base and a plurality of uniform-length rods extending from the common base in a parallel and regularly spaced-apart fashion. A first surface region is defined at outboard ends of the rods and a side region is defined about the periphery of the array. At least one electric conductor is positioned to extend through the side region and substantially parallel to the rods such that the electric conductor(s) extends at least to the first surface region. If the array is to be shaped, the electric conductors are located approximately at the midplane thereof. Spaces between the rods are filled up to the first surface region with a viscoelastic material. The common base of the block is then removed such that a second surface region parallel and opposite to the first surface region is defined. At least one electrode is deposited at the first surface region to be in contact with at least a portion of the rods and in electrical contact with the electric conductor. At least one ground electrode is deposited at the second surface region to be in contact with the rods. As a result, a piezoelectric composite transducer is formed. If a thermoplastic material is used for the viscoelastic fill material, the piezoelectric composite transducer can be shaped by heating the thermoplastic material to its plastic state.

BRIEF DESCRIPTION OF THE DRAWINGS

Other objects, features and advantages of the present invention will become apparent upon reference to the following description of the preferred embodiments and to the drawings, wherein corresponding reference characters indicate corresponding parts throughout the several views of the drawings and wherein.

DESCRIPTION OF THE PREFERRED EMBODIMENT(S)

Figure 1:
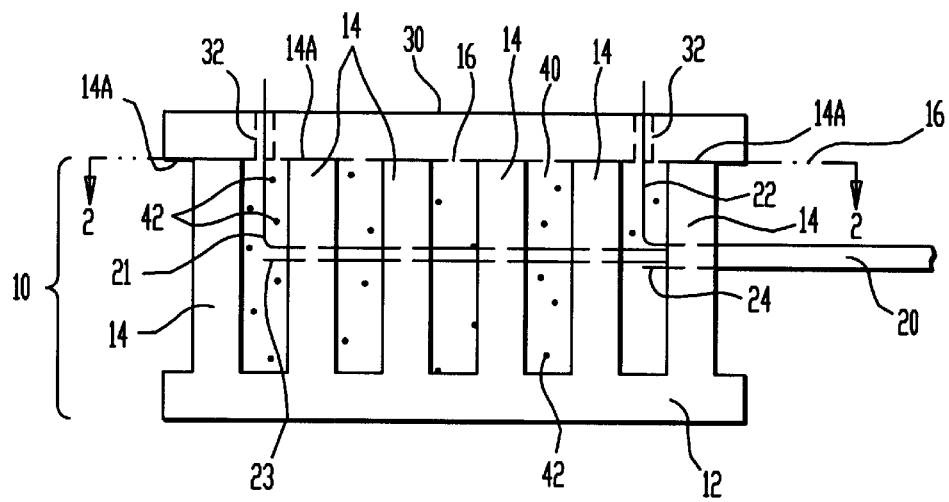
FIG. 1 is a side view of the piezoelectric rod block with the wiring harness and optional wiring template in accordance with the present invention.
Figure 2:
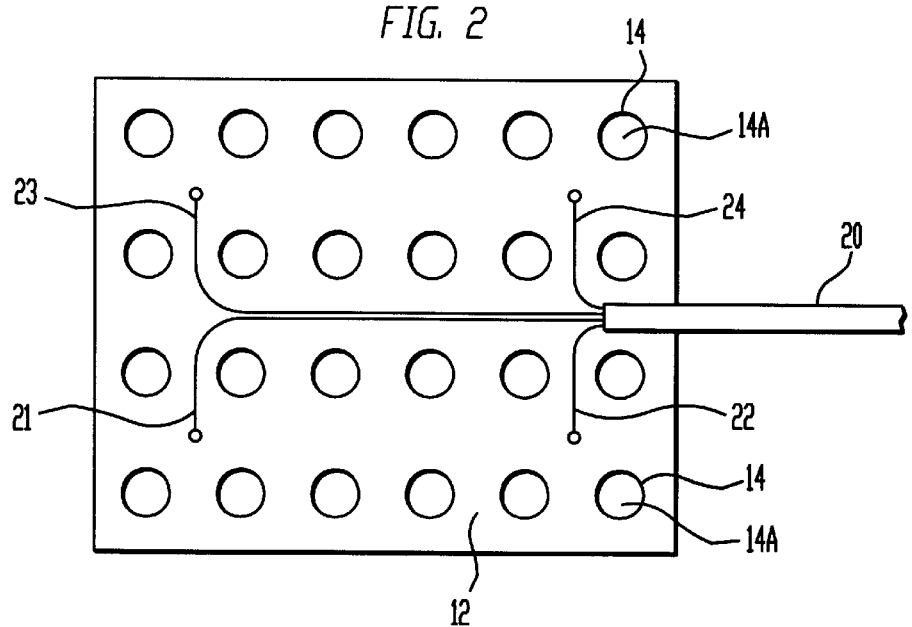
FIG. 2 is a top view of the piezoelectric composite panel with its wiring harness in a view taken along line 2—2 in FIG. 1.

Referring now to the drawings, and more particularly to FIGS. 1 and 2, the first few steps of the composite transducer assembly fabrication method of the present invention will be described. A block of piezoelectric material (e.g., a ferroelectric material such as the piezoceramic materials lead zirconate titanate or lead titanate) is illustrated and referenced generally by numeral 10. Block 10 is defined by a base 12 and a plurality of spaced-apart columns or rods 14 extending from base 12. Typically, rods 14 are of uniform height and are parallel to one another such that their outboard ends 14A define a surface region indicated by dashed line 16 in FIG. 1. Rods 14 are typically arranged in a two-dimensional array as best seen in FIG. 2. Note that viscoelastic material 40 is omitted from FIG. 2 for clarity of illustration. Rods 14 can be fabricated with a circular cross-section as shown in FIG. 2. However, rods 14 can also be fabricated with a non-circular cross-section, e.g., triangular, square, hexagonal, etc. Fabrication of block 10 is known in the art and such blocks are available commercially from, for example, Material Systems Incorporated, Littleton, Mass. .

A wiring harness 20 consisting of one or more electrical conductors, e.g., conductors 21, 22, 23 and 24 are shown by way of example, led into block 10 from a side thereof between rods 14. Conductors 21, 22, 23 and 24 are typically clad or coated with an insulating material (not shown). Each of the individual conductors 21, 22, 23 and 24 is routed between rods 14 to a specified location and then led substantially parallel to rods 14 up to or through surface region 16. Note that wiring harness 20 and conductors 21, 22, 23 and 24 should be positioned at approximately the midplane of block 10 (as illustrated) if block 10 is to be curved or shaped. Positioning at the midplane reduces stress in wiring harness 20 and conductors 21, 22, 23 and 24 during bending.

If the spacing between rods 14 is small and/or the number of electrical conductors that must be brought to surface region 16 is substantial, precise organization of the conductors can be facilitated through the use of a wiring template 30. Template 30 is provided with a plurality of holes 32 through which conductors 21, 22, 23 and 24 are led upon reaching surface region 16. The position of each of holes 32 is predetermined based on the position of the electrodes that will be deposited on the transducer assembly as will be explained further below.

With wiring harness 20 positioned in block 10 as described above, a viscoelastic material 40 is used to fill the spaces between surface region 16 and base 12. Typically, this is accomplished as a molding process as is known in the art. Accordingly, block 10 with wiring harness 20 (and possibly template 30) positioned as shown can be positioned in a mold (not shown) that allows for the molding of viscoelastic material 40. During molding, some of viscoelastic material 40 will be pushed into holes 32 if template 30 is used. If the composite transducer assembly is to be shaped to fit a contoured surface, viscoelastic material 40 can be a thermoplastic epoxy capable of achieving a plastic state when heated to a prescribed temperature. If sound speed through viscoelastic material 40 needs to be controlled, microballoons 42 (i.e., small gas-filled glass beads) can be mixed with viscoelastic material 40.

Figure 3:
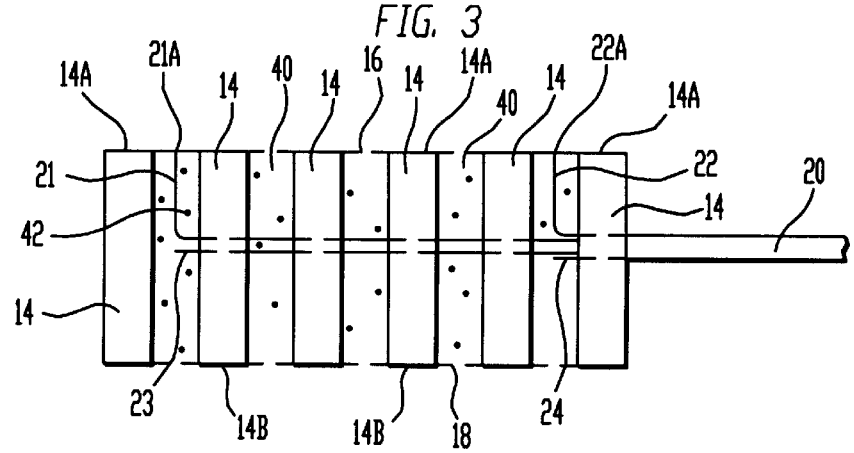
FIG. 3 is a side view of the piezoelectric rod block with the wiring harness and piezoelectric rods being held together by a viscoelastic material prior to the deposition of electrodes thereon.

Referring now to FIG. 3, once viscoelastic material 40 is set, template 30 is removed. Then, any of viscoelastic material 40 and conductors 21, 22, 23 and 24 extending beyond surface region 16 is ground down (e.g., via a Blanchard grinding process) to surface region 16 so that outboard ends 14A of rods 14 (defining surface region 16) are exposed as well as an electrically conductive face (e.g., faces 21A and 22A) of each conductor. In addition, base 10 is removed or ground down so that ends 14B of rods are exposed and define a surface region 18 as illustrated in FIG. 3. Once this has occurred, rods 14 are mechanically and electrically independent from one another and wiring harness 20 is held in place by viscoelastic material 40. Surface regions 16 and 18 are parallel to one another with rods 14 being of uniform length.

Figure 4:
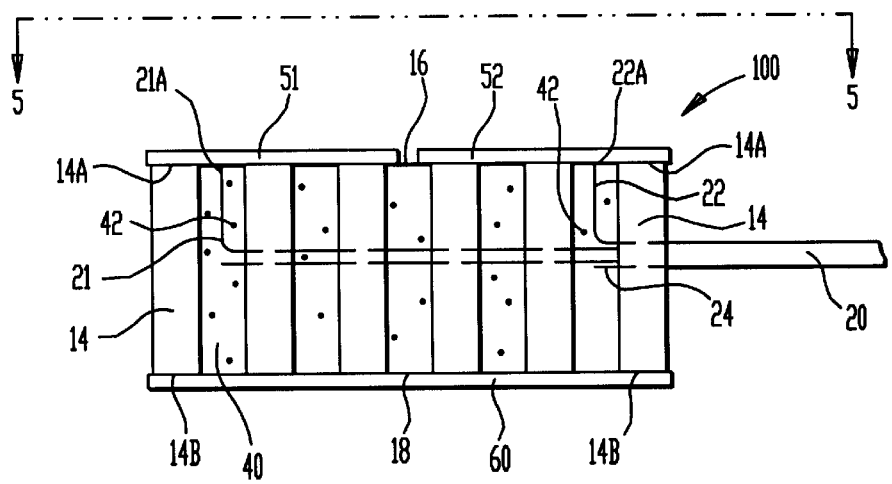
FIG. 4 is a side view of the composite transducer assembly of the present invention prior to the shaping thereof.
Figure 5:
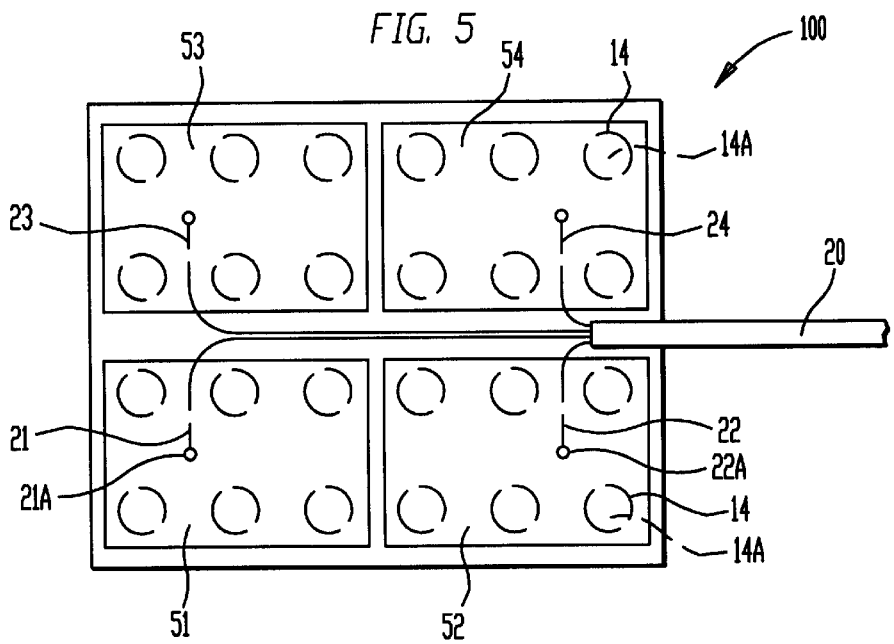
FIG. 5 is a top view of the assembly taken along line 5—5 of FIG. 4.

Referring now to FIGS. 4 and 5, the composite transducer array assembly is shown and referenced generally by numeral 100. In assembly 100, electrodes are shown positioned at each of surface regions 16 and 18. More specifically, electrodes 51, 52, 53 and 54 are deposited or plated in position at surface region 16. Each of electrodes 51, 52, 53 and 54 contact one or more of rods 14 at their ends 14A and are also in electrical contact with at least one electrical conductor. For example, electrode 51 is in electrical contact with wire face 21A. Note that because electrodes 51, 52, 53 and 54 are connected to their respective conductors from within assembly 100, no electrical connections are made on the outward facing portion of electrode 51, 52, 53 and 54. One (or more) electrodes are positioned (e.g., deposited, plated, etc.) at surface region 18 to be in contact with ends 14B of rods 14. In the illustrated example, a single electrode 60 serves as the common or ground electrode for composite transducer array assembly 100. Electrical attachment to electrode 60 is made with a separate wire (not shown).

Figure 6:
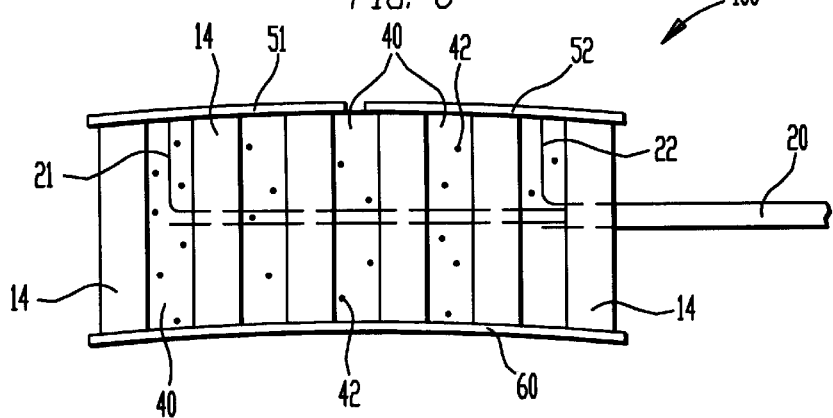
FIG. 6 is a side view of the composite transducer assembly after the shaping thereof.

Composite transducer array assembly 100 can be shaped to conform to complex contours if viscoelastic material 40 comprises a thermoplastic material such as a thermoplastic epoxy as described above. More specifically, composite transducer assembly 100 is heated to a temperature at which the thermoplastic material becomes plastic. Assembly 100 can then be shaped, for example, as illustrated in FIG. 6. Once the shaped assembly 100 cools, it will retain its shape. Note that surface regions 16 and 18 define complementary curved surfaces owing to the uniform thickness of composite transducer array assembly 100. The stretching or compression of wiring harness 20 and conductors 21, 22, 23 and 24 is mitigated by positioning them at approximately the midplane of curvature.

The advantages of the present invention are numerous. A composite transducer assembly can be shaped to conform to a variety of complex curves. Since no wire connections are made on the front face of the electrodes, the conductor-to-electrode connection is protected. Further, the viscoelastic material keeps the electrical conductors in place both during and after the fabrication process. The viscoelastic material also protects the brittle ceramic rods.

Although the present invention, has been described relative to specific embodiments thereof, it is not so limited. For example, a variety of piezoelectric materials can be used to form block 10. Similarly, a variety of viscoelastic materials can be used to backfill around rods 14. The size of the electrodes and the number of rods coupled to an electrode can be varied depending on the application.

It will therefore be understood that many additional changes in the details, materials, steps and arrangement of parts, which have been herein described and illustrated in order to explain the nature of the invention, may be made by those skilled in the art within the principle and scope of the invention as expressed in the appended claims.

What is claimed is:

1. A piezoelectric composite transducer array, comprising:
   a plurality of piezoelectric rods regularly spaced apart from one another, wherein a first surface region and a second surface region are defined at opposite ends of said plurality of piezoelectric rods and wherein a side region is defined about the periphery of said array between said first surface region and said second surface region;
   a viscoelastic material filling spaces between said first surface region and said second surface region;
   at least one electric conductor passing through said side region, extending into said viscoelastic material to a point at which said at least one conductor extends substantially parallel to said plurality of piezoelectric rods, and terminating at said first surface region; and
   at least one electrode positioned at said first surface region to be in contact with at least a portion of said plurality of piezoelectric rods and in electrical contact with said electric conductor.

2. A piezoelectric composite transducer array as in claim 1 wherein each of said plurality of piezoelectric rods is of equal length, wherein the distance between said first surface region and said second surface region is uniform.

3. A piezoelectric composite transducer array as in claim 1 wherein said first surface region and said second surface region define complementary curved surfaces.

4. A piezoelectric composite transducer array as in claim 1 wherein said viscoelastic material is a thermoplastic epoxy.

5. A piezoelectric composite transducer array as in claim 1 wherein said viscoelastic material is a thermoplastic epoxy mixed with gas-filled microballoons.

6. A piezoelectric composite transducer array as in claim 1 wherein said array is two-dimensional.

7. A piezoelectric composite transducer array as in claim 1 further comprising a ground electrode positioned at said second surface region and in contact with said plurality of piezoelectric rods.

8. A piezoelectric composite transducer array as in claim 1 wherein said plurality of piezoelectric rods are made from a ferroelectric material.

9. A piezoelectric composite transducer array, comprising:
- a plurality of uniform-length piezoelectric rods spaced apart from one another and arranged in an array, wherein a first surface region and a second surface region are defined at opposite ends of said plurality of piezoelectric rods and wherein a side region is defined about the periphery of said array between said first surface region and said second surface region, said first surface region and said second surface region defining complementary curved surfaces;
- a viscoelastic material filling spaces between said first surface region and said second surface region;
- a plurality of electric conductors passed through said side region, routed through said viscoelastic material to extend substantially parallel to said plurality of piezoelectric rods, and terminated at different areas of said first surface region;
- a plurality of electrodes positioned at said first surface region, each of said plurality of electrodes in contact with at least one of said plurality of piezoelectric rods and in electrical contact with at least one of said plurality of electric conductors; and
- at least one ground electrode positioned at said second surface region and in contact with said plurality of piezoelectric rods.

10. A piezoelectric composite transducer array as in claim 9 wherein said viscoelastic material is a thermoplastic epoxy.

11. A piezoelectric composite transducer array as in claim 9 wherein said viscoelastic material is a thermoplastic epoxy mixed with gas-filled microballoons.

12. A piezoelectric composite transducer array as in claim 9 wherein said array is two-dimensional.

13. A piezoelectric composite transducer array as in claim 9 wherein said plurality of piezoelectric rods are made from a ferroelectric material.

14. A piezoelectric composite transducer array as in claim 9 wherein each of said plurality of electrodes is in contact with an identical quantity of said plurality of piezoelectric rods.

* * * * *